(12) United States Patent
Togashi

(10) Patent No.: US 10,038,819 B2
(45) Date of Patent: Jul. 31, 2018

(54) SIGNAL PROCESSING APPARATUS, IMAGE PROCESSING APPARATUS, AND SIGNAL PROCESSING METHOD

(71) Applicant: CANON KABUSHIKI KAISHA, Tokyo (JP)

(72) Inventor: Kazunori Togashi, Toride (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/272,409

(22) Filed: Sep. 21, 2016

(65) Prior Publication Data

US 2017/0094113 A1    Mar. 30, 2017

(30) Foreign Application Priority Data

Sep. 24, 2015 (JP) ................. 2015-187304

(51) Int. Cl.
| | |
|---|---|
| H04N 1/40 | (2006.01) |
| H04N 1/401 | (2006.01) |
| H03M 1/12 | (2006.01) |
| H04N 1/03 | (2006.01) |
| H04N 5/369 | (2011.01) |
| H04N 5/376 | (2011.01) |
| H04N 5/378 | (2011.01) |
| H04N 5/232 | (2006.01) |

(52) U.S. Cl.
CPC .......... *H04N 1/401* (2013.01); *H03M 1/1245* (2013.01); *H04N 1/03* (2013.01); *H04N 5/23229* (2013.01); *H04N 5/3692* (2013.01); *H04N 5/378* (2013.01); *H04N 5/3765* (2013.01); *H04N 2201/0081* (2013.01); *H04N 2201/0094* (2013.01)

(58) Field of Classification Search
CPC ...... H04N 1/401; H04N 1/03; H04N 5/23229; H04N 5/3692; H04N 5/3765; H04N 5/378; H03M 1/1245
USPC ........................................ 358/445, 403, 443
See application file for complete search history.

(56) References Cited

U.S. PATENT DOCUMENTS 8,081,100 B2    12/2011 Kanno
2006/0044386 A1*    3/2006 Ishikawa ............ H04N 1/40031
                                                                    347/238

* cited by examiner

*Primary Examiner* — Cheukfan Lee
(74) *Attorney, Agent, or Firm* — Fitzpatrick, Cella, Harper & Scinto

(57) ABSTRACT

Provided is a signal processing apparatus that enables an image reading apparatus to perform higher speed processing of reading a document image. A signal processing unit is configured to convert six analog image signals obtained from a line sensor into six first signals, each of which is a 10-bit digital image signal, respectively, and to write the six first signals into a RAM at a first speed that is the same as a frequency of the analog image signals. The signal processing unit is configured to cause a serialization unit to read out from the RAM the six first signals as four second signals, each of which is a 10-bit digital image signal, at a second speed higher than the first speed, respectively, and to serialize the four second signals to generate six 7-bit serial signals.

20 Claims, 6 Drawing Sheets

SIGNAL PROCESSING APPARATUS, IMAGE PROCESSING APPARATUS, AND SIGNAL PROCESSING METHOD

BACKGROUND OF THE INVENTION

Field of the Invention

The present invention relates to a signal processing apparatus to be used for an image reading apparatus, e.g., a scanner, which is configured to read an image of a document (hereinafter referred to as "document image").

Description of the Related Art

An image reading apparatus is configured to receive, with a line sensor, reflected light of light that has been radiated to a document and generate an analog image signal representing a document image by performing photoelectric conversion of the received reflected light. The analog image signal is converted into a digital image signal by a sample-and-hold circuit and an AD converter. Analog signal processing circuits such as the sample-and-hold circuit and the AD converter are integrated to be prepared as a signal processing apparatus for conducting front-end processing. In addition to the sample-and-hold circuit and the AD converter, the signal processing apparatus includes, for example, a gain amplifier, a DA converter for offset adjustment, and a timing generator configured to generate a control signal for controlling an operation timing inside the signal processing apparatus.

In many cases, the signal processing apparatus is placed on a board having a line sensor mounted thereon in proximity to the line sensor. The digital image signal is transmitted from the signal processing apparatus to an apparatus in a subsequent stage (for example, apparatus for controlling an image reading apparatus) as a low-voltage differential signal (LVDS). In U.S. Pat. No. 8,081,100, there is disclosed an image reading apparatus configured to convert an analog image signal of three RGB colors output from the line sensor into five pairs of image LVDS signals for transmission. This image reading apparatus is configured to transmit, in synchronization with the image LVDS signals, a pair of clock signals (hereinafter referred to as "clock LVDS signal") for frame synchronization. The clock LVDS signal is also an LVDS signal. In this image reading apparatus, for example, when the frequency of the analog image signal of each color is 40 MHz, the transfer rate of the image LVDS signal is 280 Mbps and the frequency of the clock LVDS signal is 40 MHz.

When the reading speed of a document image is increased, the frequency of an analog image signal to be output by the line sensor needs to be increased. In order to achieve the increased reading speed, the line sensor configured to read a color image transmits two analog image signals for each color to the signal processing apparatus. In this case, the transfer rate of the image LVDS signal to be output by the signal processing apparatus is also increased. For example, when the frequency of two analog image signals for each RGB color to be output by the line sensor is 40 MHz, the transfer rate for a pair of image LVDS signals is 560 Mbps and the frequency of the clock LVDS signal is 80 MHz.

The signal processing apparatus transmits an image LVDS signal and a clock LVDS signal through an inexpensive flexible flat cable. The flexible flat cable is not adequate for high-speed transmission, and as the cable length becomes longer, the degradation of a signal waveform becomes more severe. In order to maintain the waveform qualities of the image LVDS signal and the clock LVDS signal at an appropriate level, a dedicated cable optimized for transmission of LVDS signals is available. However, the dedicated cable is expensive and leads to an increased cost of the image reading apparatus, and thus is not a practical solution. It is an object of the present invention to provide a signal processing apparatus that enables higher speed processing of reading a document image.

SUMMARY OF THE INVENTION

According to the present disclosure, there is provided a signal processing apparatus comprising: an AD conversion unit configured to convert six analog image signals obtained from a sensor configured to read a document image into six first signals, each of which is a 10-bit digital image signal, respectively; a memory unit configured to allow the six first signals to be written therein at a first speed that is the same as a frequency of the six analog image signals; a serialization unit configured to: read out from the memory unit the six first signals as four second signals, each of which is a 10-bit digital image signal, at a second speed lower than two times the first speed, respectively; and serialize the four second signals to generate six 7-bit serial signals; and a transmission unit configured to convert the six 7-bit serial signals into low-voltage differential signals, respectively, and to transmit the low-voltage differential signals to an apparatus in a subsequent stage.

Further features of the present invention will become apparent from the following description of exemplary embodiments (with reference to the attached drawings).

DESCRIPTION OF THE EMBODIMENTS

Now, a description is given in detail of an embodiment of the present invention with reference to the drawings.

Figure 1:
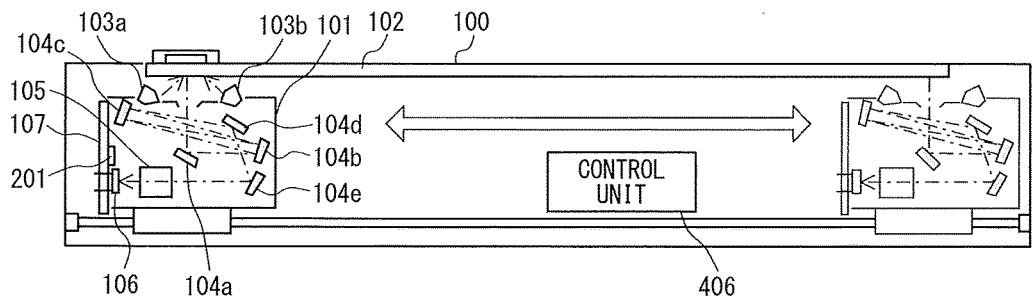
FIG. 1 is a configuration diagram for illustrating an image reading apparatus.

FIG. 1 is a configuration diagram for illustrating an image reading apparatus according to this embodiment. The image reading apparatus 100 has a built-in optical box 101. A document to be read is placed on a platen 102. The optical box 101 includes light emitting diodes (LEDs) 103a and 103b serving as illumination units, reflection mirrors 104a, 104b, 104c, 104d, and 104e, an imaging lens 105, and a line sensor 106. Reading of a document image by the image reading apparatus 100 is controlled by a control unit 406.

The LEDs 103a and 103b are configured to illuminate a document placed on the platen 102 with light. The LEDs 103a and 103b suppress generation of shadows by illuminating a document with light in mutually different directions. The reflection mirrors 104a, 104b, 104c, 104d, and 104e form an optical system for guiding a reflected light that has been reflected by a document to the imaging lens 105. The imaging lens 105 is configured to form an image of the reflected light on the line sensor 106. The line sensor 106 includes a light reception surface on which the reflected light forms an image. The light reception surface is formed of a plurality of light reception elements being arrayed in the depth direction of FIG. 1. Thus, the depth direction of FIG. 1 is a main scanning direction of the image reading apparatus 100.

The optical box 101 thus configured is capable of moving within the image reading apparatus 100 in a sub-scanning direction (in the arrow direction of FIG. 1). At the time of processing of reading a document image, the optical box 101 moves in the arrow direction while illuminating a document on the platen 102 with light using the LEDs 103a and 103b. The LEDs 103a and 103b may be configured to move in the main scanning direction or may be configured by a plurality of LEDs being arrayed in the main scanning direction.

The line sensor 106 is implemented on a line sensor board 107 together with a signal processing unit 201. The line sensor 106 is configured to generate an analog image signal by performing photoelectric conversion of the reflected light that has been received on the light reception surface. The line sensor 106 is a color line sensor, and generates an analog image signal corresponding to each RGB color. The analog image signal is input to the signal processing unit 201. The signal processing unit 201 is a front-end apparatus configured to perform signal processing on an analog image signal. The signal processing unit 201 converts an analog image signal into an image LVDS signal, which is a low-voltage differential signal (LVDS signal), and transmits the image LVDS signal to the control unit 406 together with a clock LVDS signal. The signal processing unit 201 is realized by, for example, an integrated circuit.

The signal processing unit 201 and the control unit 406 are connected to each other via a transmission cable. The transmission cable is, for example, an inexpensive flexible flat cable having excellent slidability. The flexible flat cable includes a signal line for transmitting and receiving various kinds of signals in addition to the LVDS signal between the signal processing unit 201 and the control unit 406. The slidability of the flexible flat cable enables transmission of signals between the signal processing unit 201 and the control unit 406 even when the optical box 101 moves in the sub-scanning direction.

Figure 2:
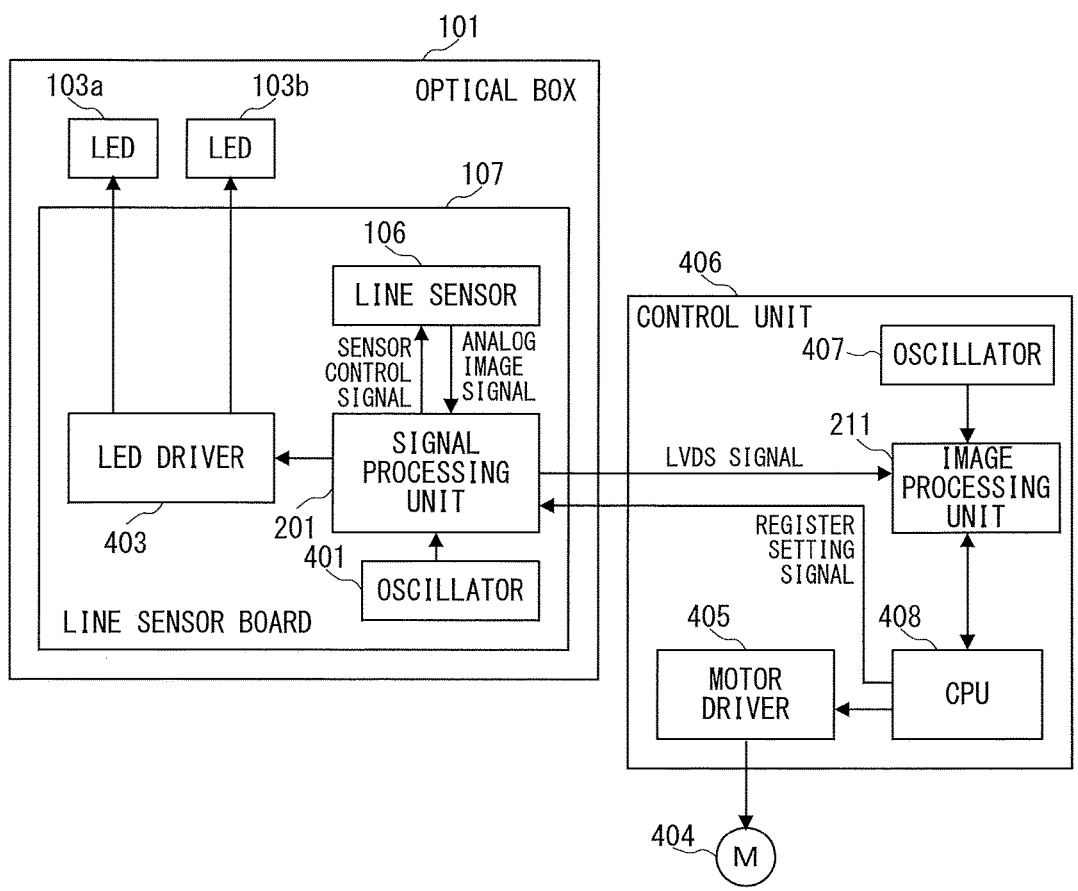
FIG. 2 is an explanatory diagram for illustrating configurations of an optical box and a control unit.

FIG. 2 is an explanatory diagram for illustrating configurations of the optical box 101 and the control unit 406.

The optical box 101 includes an oscillator 401 and an LED driver 403 on the line sensor board 107 in addition to the line sensor 106 and the signal processing unit 201. The oscillator 401 is configured to supply a reference clock signal to the signal processing unit 201. The LED driver 403 is configured to perform illumination control of the LEDs 103a and 103b based on control by the signal processing unit 201. The signal processing unit 201 is configured to transmit a sensor control signal for causing the line sensor 106 to output an analog image signal.

The control unit 406 includes a motor driver 405, an oscillator 407, an image processing unit 211, and a central processing unit (CPU) 408. The image processing unit 211 and the CPU 408 are connected to each other via a bus for communication. The motor driver 405 is controlled by the CPU 408 to perform drive control of a motor 404. The motor 404 is a drive source for moving the optical box 101 in the sub-scanning direction. The oscillator 407 is configured to supply a reference clock signal to the image processing unit 211. The image processing unit 211 is configured to obtain the image LVDS signal and the clock LVDS signal from the signal processing unit 201, and to generate an image signal serving as a final digital signal representing a document image. The image signal is output to an external apparatus. When the image reading apparatus 100 is installed on a multifunction peripheral, the external apparatus is, for example, an image forming apparatus. The image processing unit 211 is, for example, realized by an integrated circuit.

The CPU 408 is configured to control an overall operation of the image reading apparatus 100. For example, the CPU 408 performs on the image processing unit 211 various settings for converting the image LVDS signal into an image signal. The CPU 408 performs on the signal processing unit 201 various settings for controlling the line sensor 106, the LEDs 103a and 103b, and the like. The CPU 408 transmits a motor control signal for controlling an excitation current of the motor 404 to the motor driver 405, and controls a movement of the optical box 101.

Figure 3:
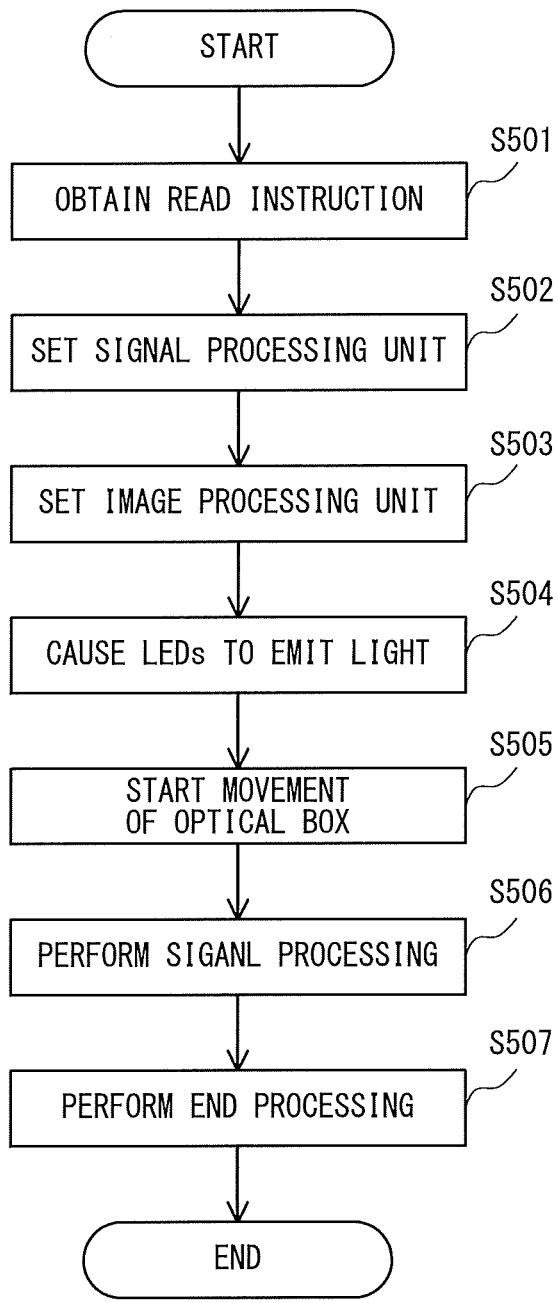
FIG. 3 is a flowchart for illustrating processing of reading a document image.

FIG. 3 is a flowchart for illustrating processing of reading a document image by the image reading apparatus 100. The document is placed on the platen 102 with its plane to be read facing the optical box 101.

The CPU 408 obtains an instruction to read a document image from an operation unit (not shown) (Step S501), and performs various settings on the signal processing unit 201. Accordingly, the signal processing unit 201 is set to be ready for generating an image LVDS signal from an analog image signal, and outputting the generated image LVDS signal together with a clock LVDS signal. Further, the optical box 101 is set to be ready for reading a document image (Step S502).

The CPU 408 performs various settings on the image processing unit 211. Accordingly, the image processing unit 211 is set to be ready for processing an image LVDS signal and a clock LVDS signal to be obtained from the signal processing unit 201 (Step S503).

The CPU 408 causes the LEDs 103a and 103b to emit light by the LED driver 403 through intermediation of the signal processing unit 201 (Step S504). The LED driver 403 causes the LEDs 103a and 103b to emit light by supplying drive current to the LEDs 103a and 103b. After the LEDs 103a and 103b emit light, the line sensor 106 receives reflected light that has been reflected by a document to read a document image. The CPU 408 drives the motor 404 through the motor driver 405 to cause the optical box 101 to move in the sub-scanning direction (Step S505). Accordingly, the optical box 101 reads the document image from the entire surface of the document while moving in the sub-scanning direction.

The line sensor 106 generates an analog image signal representing a document image by performing photoelectric conversion of the received reflected light. The line sensor 106 transmits the generated analog image signal to the signal processing unit 201. The signal processing unit 201 converts the analog image signal into an image LVDS signal. The signal processing unit 201 transmits the image LVDS signal to the image processing unit 211 together with the clock LVDS signal. The image processing unit 211 performs predetermined processing on the image LVDS signal and the clock LVDS signal to generate an image signal serving as a final digital signal representing the document image (Step S506). The image processing unit 211 transmits the generated image signal to a predetermined external apparatus.

After the image signal is transmitted, the CPU 408 turns off the LEDs 103a and 103b and stops various settings of the signal processing unit 201 and the image processing unit 211, to end the read processing (Step S507). The image reading apparatus 100 is stopped and waits for a subsequent read instruction.

Now, a description is given in detail of configurations and processing of the signal processing unit 201 and the image processing unit 211. The signal processing unit 201 converts an analog image signal into a digital image signal, a serial signal, and then into an image LVDS signal in the stated order, and then transmits the image LVDS signal to the image processing unit 211. The image processing unit 211 converts the received image LVDS signal into a single end signal, deserializes the single end signal, and then generates a final image signal.

The line sensor 106 generates one or two analog image signals for each RGB color. Thus, the line sensor 106 transmits three or six analog image signals to the signal processing unit 201. The signal processing unit 201 generates six pairs of image LVDS signals from the three or six analog image signals, and outputs those signals. The image processing unit 211 generates an image signal for each RGB color from the six pairs of image LVDS signals. In this embodiment, even when the frequency of the analog image signal is the same as that of the related art, the transfer rate of the image LVDS signal to be transmitted from the signal processing unit 201 to the image processing unit 211 is reduced compared to the related art. Through reduction of the transfer rate of the image LVDS signal, it is possible to suppress the signal degradation even when a flexible flat cable is used for connection between the signal processing unit 201 and the control unit 406.

Now, a description is made for a case in which a line sensor outputs six analog image signals.

Figure 4:
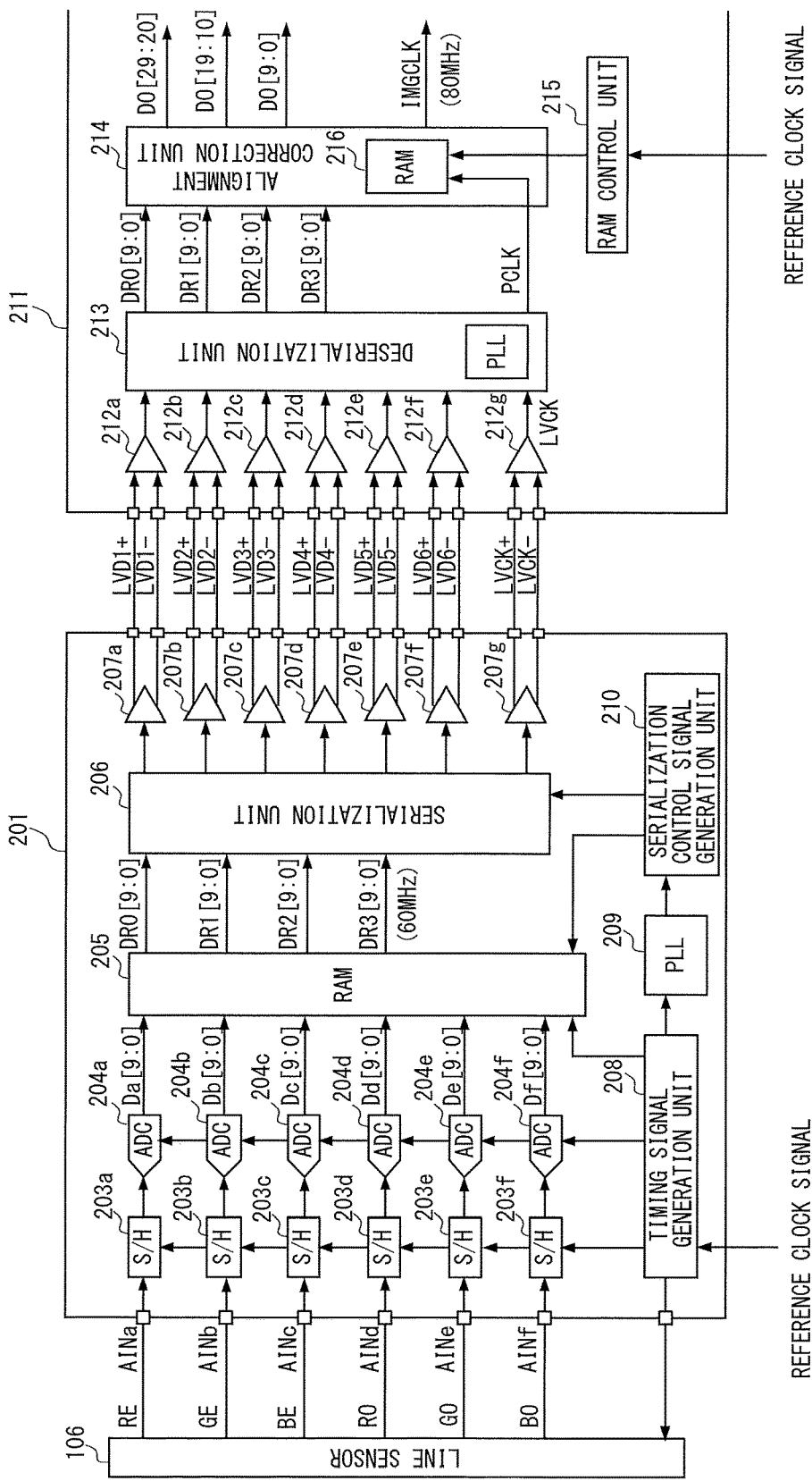
FIG. 4 is an explanatory diagram for illustrating configurations of a signal processing unit and an image processing unit.

FIG. 4 is an explanatory diagram for illustrating configurations of the signal processing unit 201 and the image processing unit 211. The line sensor 106 transmits two analog image signals for each RGB color to the signal processing unit 201. The line sensor 106 includes two output terminals for each color to output the analog image signal. Odd-numbered output terminals output analog image signals RE, GE, BE, respectively. Even-numbered output terminals output analog image signals RO, GO, BO, respectively.

The signal processing unit 201 includes analog input terminals AINa to AINf corresponding to the output terminals of the line sensor 106. The analog image signal RE is input to the analog input terminal AINa. The analog image signal GE is input to the analog input terminal AINb. The analog image signal BE is input to the analog input terminal AINc. The analog image signal RO is input to the analog input terminal AINd. The analog image signal GO is input to the analog input terminal AINe. The analog image signal BO is input to the analog input terminal AINf.

The signal processing unit 201 includes sample-and-hold units (S/Hs) 203a to 203f, AD conversion units (ADCs) 204a to 204f, a random access memory (RAM) 205, a serialization unit 206, and LVDS transmission units 207a to 207g. Those units are components for converting the analog image signals RE, GE, BE, RO, GO, and BO into image LVDS signals LVD1+, – to LVD6+, –. In addition to those components, the signal processing unit 201 includes a timing signal generation unit 208, a phase locked loop (PLL) 209, and a serialization control signal generation unit 210. Those units are components for controlling operation timings of the signal processing unit 201 and the line sensor 106, and generating the clock LVDS signal.

The S/Hs 203a to 203f are configured to sample and hold the analog image signals RE, GE, BE, RO, GO, and BO input to the analog input terminals AINa to AINf. The ADCs 204a to 204f are configured to digitalize the analog image signals RE, GE, BE, RO, GO, and BO sampled and held in the S/Hs 203a to 203f, to generate digital image signals Da[9:0] to Df[9:0] of 10 bits per pixel. The ADCs 204a to 204f accumulate the generated digital image signals Da[9:0] to Df[9:0] in the RAM 205.

The digital image signals Da[9:0] to Df[9:0] accumulated in the RAM 205 are sequentially read out by the serialization unit 206 as four 10-bit digital image signals DR0[9:0] to DR3[9:0] (equivalent to four pixels). Signals are written into the RAM 205 in units of six pixels (digital image signals Da[9:0] to Df[9:0]) and are read out from the RAM 205 in units of four pixels (digital image signals DR0[9:0] to DR3[9:0]). For this purpose, the RAM 205 is configured to make the reading speed higher than the writing speed so as to prevent an overflow. The reading speed is, for example, a frequency that is lower than two times the frequency of the analog image signals RE, GE, BE, RO, GO, and BO. Further, the RAM 205 has a storage capacity that is at least large enough to prevent an overflow caused by a written amount exceeding a read amount.

The serialization unit 206 is configured to serialize the digital image signals DR0[9:0] to DR3[9:0] read out from the RAM 205. The serialization unit 206 converts all the signals of 40 bits forming the read image signals DR0[9:0] to DR3[9:0] of four pixels into six 7-bit serial signals. The serialization unit 206 inputs the serial signals into the LVDS transmission units 207a to 207f.

The LVDS transmission units 207a to 207f are configured to convert the input serial signals into LVDS signals and output those signals. For example, the LVDS transmission unit 207a converts a serial signal into a pair of image LVDS signals LVD1+, –, and output those signals. The image LVDS signals LVD1+, – to LVD6+, – output from the LVDS transmission units 207a to 207f are transmitted to the image processing unit 211.

The timing signal generation unit 208 is configured to generate control signals of the S/Hs 203a to 203f and the ADCs 204a to 204f, and a write control signal for controlling a timing of writing into the RAM 205 based on the reference clock signal supplied from the oscillator 401. Further, the timing signal generation unit 208 generates a sensor control signal to be supplied to the line sensor 106.

When the line sensor 106 outputs the analog image signals RE, GE, BE, RO, GO, and BO with the frequency of 40 MHz, the timing signal generation unit 208 transmits the sensor control signal with the frequency of 40 MHz to the line sensor 106. In order to digitalize the analog image signals RE, GE, BE, RO, GO, and BO of 40 MHz, the timing signal generation unit 208 supplies control signals of 40 MHz to the S/Hs 203a to 203f and the ADCs 204a to 204f. The timing signal generation unit 208 also supplies a write control signal of 40 MHz to the RAM 205. The control signals of 40 MHz supplied to the S/Hs 203a to 203f and the ADCs 204a to 204f are also supplied to the PLL 209.

The PLL 209 is configured to generate a clock signal by subjecting the control signal supplied from the timing signal generation unit 208 to multiplication, and supply the generated clock signal to the serialization control signal generation unit 210. For example, the PLL 209 subjects the control signal of 40 MHz to 21/2 multiplication to generate a clock signal of 420 MHz.

The serialization control signal generation unit 210 is configured to generate a read-out control signal for controlling reading out from the RAM 205 and a serialization control signal for controlling serialization by the serialization unit 206 based on the clock signal supplied from the PLL 209. For example, the serialization control signal generation unit 210 generates a read-out control signal of 60 MHz by dividing the clock signal of 420 MHz supplied from the PLL 209 by seven. The clock signal of 420 MHz is used as it is for the serialization control signal. The serialization unit 206 generates a synchronization signal that is in synchronization with the image LVDS signals output by the LVDS transmission units 207a to 207f, and supplies the synchronization signal to the LVDS transmission unit 207g. The LVDS transmission unit 207g converts the synchronization signal into a pair of clock LVDS signals LVCK+, –, and outputs those signals. For example, the LVDS transmission unit 207g outputs the clock LVDS signals LVCK+, – of 60 MHz in synchronization with the image LVDS signals LVD1+, – to LVD6+, –.

The image processing unit 211 includes LVDS reception units 212a to 212g, a deserialization unit 213, an alignment correction unit 214, and a RAM control unit 215.

The LVDS reception units 212a to 212g are configured to receive the image LVDS signals LVD1+, – to LVD6+, – and the clock LVDS signals LVCK+, – from the signal processing unit 201, and convert those signals into single end signals.

The deserialization unit 213 is configured to convert the single end signals into parallel signals DR0[9:0] to DR3[9:0], which is processing reverse to processing by the serialization unit 206. For example, the deserialization unit 213 converts the six 7-bit serial signals output by the LVDS reception units 212a to 212f into 6*7=42 parallel signals [41:0]. The deserialization unit 213 has a built-in PLL. This PLL generates a control signal for deserialization based on the clock LVDS signals LVCK+, – converted into the single end signals. For example, the PLL generates a control signal of 420 MHz by multiplying the clock LVDS signals LVCK+, – of 60 MHz converted into the single end signals by seven. The deserialization unit 213 outputs, based on the control signal, the parallel signals DR0[9:0] to DR3[9:0] of four pixels within the parallel signals [41:0] together with an image clock PCLK in synchronization with the parallel signals.

The alignment correction unit 214 is configured to accumulate the parallel signals DR0[9:0] to DR3[9:0] output by the deserialization unit 213, and the image clock PCLK as the write control signal, in a built-in RAM 216. The alignment correction unit 214 sequentially reads out the image signals DO[29:20], DO[19:10], and DO[9:0] of predetermined three pixels from the RAM 216, and outputs those signals. The predetermined three pixels are each one of the RGB colors. The alignment correction unit 214 outputs an image clock IMGCLK in synchronization with the image signals DO[29:20], DO[19:10], and DO[9:0]. The image signals DO[29:20], DO[19:10], and DO[9:0] and the image clock IMGCLK are transmitted to an external apparatus in a subsequent stage.

The RAM control unit 215 is configured to generate a read-out control signal for the RAM 216 within the alignment correction unit 214. The frequency of the read-out control signal is determined based on the reference clock signal obtained from the oscillator 407. For example, when the frequency of the reference clock signal is 80 MHz, the RAM control unit 215 sets the frequency of the read-out control signal as 80 MHz. Accordingly, the reading speed of the image signal from the RAM 216 is 80 MHz.

Figure 5:
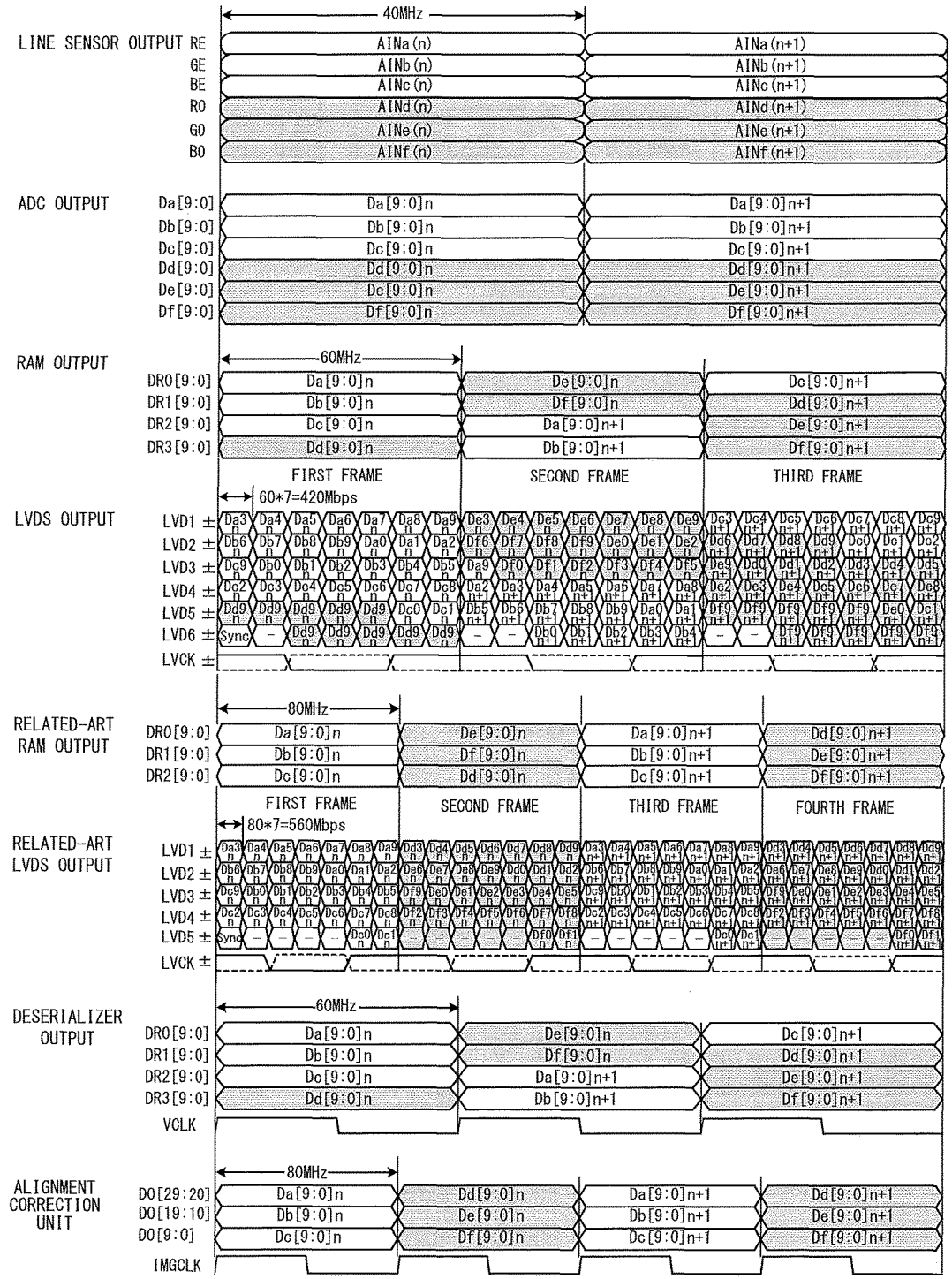
FIG. 5 is a timing chart for illustrating internal processing of the signal processing unit and the image processing unit.

FIG. 5 is a timing chart for illustrating internal processing of the signal processing unit 201 and the image processing unit 211. In this timing chart, the analog image signals RE, GE, BE, RO, GO, and BO are output based on the sensor control signal of 40 MHz from the line sensor 106. Circuit delay is not taken into consideration. In FIG. 5, "n" and "n+1" each represent a pixel order.

The ADCs 204a to 204f output the digital image signals Da[9:0] to Df[9:0] at a data rate corresponding to the frequency of the analog image signals RE, GE, BE, RO, GO, and BO. In this case, the digital image signals Da[9:0] to Df[9:0] are output at a data rate corresponding to the frequency of 40 MHz. The digital image signals Da[9:0] to Df[9:0] are written into the RAM 205 at the same writing speed as the data rate.

The digital image signals DR0[9:0] to DR3[9:0] are read out from the RAM 205 at a higher reading speed than the writing speed. In this chart, the digital image signals DR0[9:0] to DR3[9:0] are read out at a reading speed of 60 MHz. The reading speed is one and a half times higher than the writing speed. The reading speed is a frequency that is lower than two times the writing speed, namely, the frequency of the analog image signals RE, GE, BE, RO, GO, and BO. In this embodiment, the reading speed is three quarters of two times the writing speed. Further, the digital image signals Da[9:0] to Df[9:0] of six pixels are written into the RAM 205 in a single writing operation, and the digital image signals DR0[9:0] to DR3[9:0] of four pixels are read out from the RAM 205 in a single reading operation.

The LVDS transmission units 207a to 207f output the image LVDS signals LVD1+, – to LVD6+, – generated based on the digital image signals DR0[9:0] to DR3[9:0] and the clock LVDS signals LVCK+, –. The serialization unit 206 generates six 7-bit serial signals from the digital image signals DR0[9:0] to DR3[9:0]. Those six 7-bit serial signals are converted into the image LVDS signals LVD1+, – to LVD6+, – and output. The frame frequency of the image LVDS signals LVD1+, – to LVD6+, – is the same as that of the reading speed from the RAM 205, and is 60 MHz. The transfer rate of the image LVDS signals LVD1+, – to LVD6+, – is 420 Mbps, which is seven times the frame frequency, because one frame has 7 bits.

The LVDS transmission units 207a to 207f output 7 bits*6 lines=42 bits of data as one frame, but in actuality outputs digital image signals of 40 bits, resulting in a surplus of 2 bits. One bit out of those 2 bits may be used for main scanning image area processing by the image processing unit 211 as data for recognizing the head of an image in the main scanning direction.

In the related art, the reading speed from the RAM 205 is 80 MHz, and the digital image signals DR0[9:0] to DR2[9:0] of three pixels are read out in a single reading operation. The serialization unit 206 serializes a total of 30 bits of the digital image signals DR0[9:0] to DR2[9:0] of three pixels into five 7-bit serial signals. The frame frequency of the image LVDS signals LVD1+, – to LVD5+, – converted from the serial signals is 80 MHz, which is the same as that of the reading speed from the RAM 205. The transfer rate of the image LVDS signals LVD1+, – to LVD5+, – is 560 Mbps, which is seven times the frame frequency, because one frame has 7 bits. Compared to the transfer rate of the related art, in this embodiment, it is possible to transmit the image LVDS signals LVD1+, – to LVD6+, – to the image processing unit 211 at a low speed. Thus, it is possible to prevent degradation of signals caused by the flexible flat cable.

The image LVDS signals LVD1+, – to LVD6+, – transmitted to the image processing unit 211 via the flexible flat cable are converted into single end signals at the LVDS reception units 212a to 212f, and then are deserialized by the deserialization unit 213. The deserialization unit 213 performs processing reverse to processing by the serialization unit 206 so as to generate the parallel signals DR0[9:0] to DR3[9:0] based on the single end signals. The parallel signals DR0[9:0] to DR3[9:0] are accumulated in the RAM 216 of the alignment correction unit 214 at the writing speed of 60 MHz.

The alignment correction unit 214 reads out the image signals at the reading speed of 80 MHz from the RAM 216, and outputs three 10-bit image signals DO[29:20], DO[19:10], and DO[9:0] at the data rate of 80 MHz. This data rate is two times higher than the frequency of the analog image signals RE, GE, BE, RO, GO, and BO. The image signal DO[29:20] is an image signal of R (red). The image signal DO[19:10] is an image signal of G (green). The image signal DO[9:0] is an image signal of B (blue). When the alignment correction unit 214 reads out an image signal from the RAM 216, the alignment correction unit 214 alternatively reads out image signals corresponding to outputs from the even-numbered output terminals and image signals corresponding to outputs from the odd-numbered output terminals of the line sensor 106. In this manner, the alignment correction unit 214 outputs respective 10-bit image signals DO[29:20], DO[19:10], and DO[9:0] from the head of one line of an image in the main scanning direction such that the image signals are arrayed in the same order as the light reception elements of the line sensor 106 in the main scanning direction.

When the alignment correction unit 214 only needs to output a predetermined range of pixels in the main scanning direction of the analog image signal, which is output by the line sensor 106 within a predetermined time period, it is also possible to read out the image signal with the reading speed from the RAM 216 being lower than 80 MHz. Further, depending on the range of pixels to be read out in the main scanning direction, a control signal of 60 MHz to be generated by the deserialization unit 213 may be used as the read-out control signal of the RAM 205.

When the line sensor 106 outputs the six analog image signals RE, GE, BE, RO, GO, and BO, the configurations of the signal processing unit 201 and the image processing unit 211 described above may be used. For example, the line sensor 106 may be a contact image sensor including six output terminals.

Regarding a line sensor configured not to output an analog image signal in order from the head of the main scanning direction, e.g., a contact image sensor, the RAM 216 within the alignment correction unit 214 includes a line memory capable of holding one line of image signals. One line of image signals is obtained by performing control such that the reading out order of the RAM 216 is arranged in order from the head of the main scanning direction.

With the configuration described above, the signal processing unit 201 can transmit 6 pairs*7 bits=42 bits of data as one frame to the image processing unit 211 in order to output 6 pairs of LVDS signals. In the related art, a configuration in which 10-bit image signals of three pixels are transmitted at one time is adopted. However, in this embodiment, 10-bit image signals of four pixels are transmitted at one time. The signal processing unit 201 achieves reduction by 25% of the reading speed of the RAM 205 from 80 MHz of the related art to 60 MHz in order to decrease the transmission speed of the image signal by an increased amount of pixels to be transmitted. Accordingly, the LVDS transmission units 207a to 207f can achieve reduction of the transmission speed from 560 Mbps of the related art to 420 Mbps.

Now, a description is made for a case in which a line sensor outputs three analog image signals.

Figure 6:
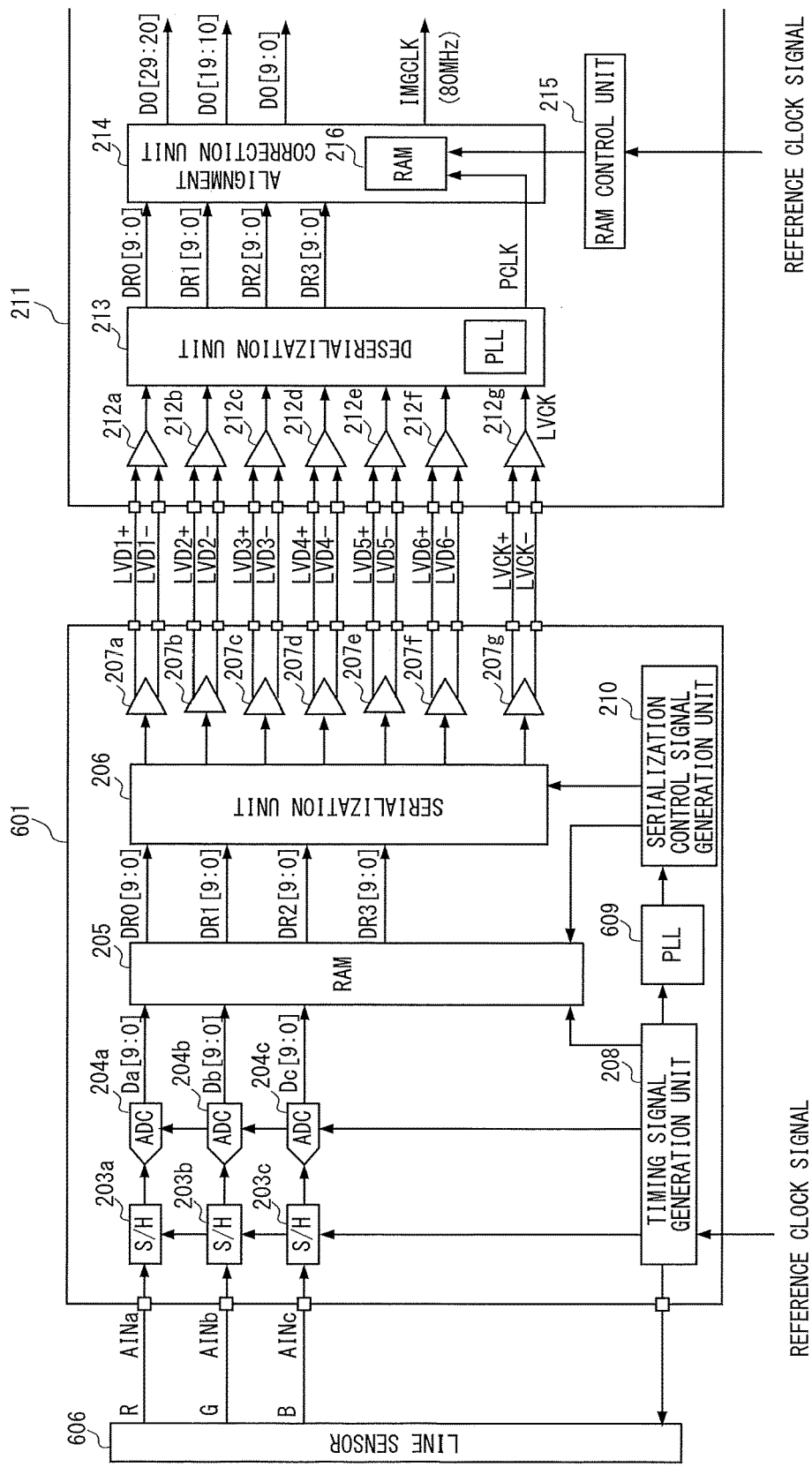
FIG. 6 is an explanatory diagram for illustrating configurations of a signal processing unit and the image processing unit.

FIG. 6 is an explanatory diagram for illustrating configurations of a signal processing unit 601 and the image processing unit 211. A line sensor 606 transmits one analog image signal for each RGB color to the signal processing unit 601. The line sensor 606 includes one output terminal for each color to output the analog image signal and outputs analog image signals R, G, and B. Functions that are the same as those illustrated in the explanatory diagram of FIG. 4 are denoted by the same reference symbols.

The signal processing unit 601 includes analog input terminals AINa, AINb, and AINc corresponding to the output terminals of the line sensor 606. The analog image signal R is input to the analog input terminal AINa. The analog image signal G is input to the analog input terminal AINb. The analog image signal B is input to the analog input terminal AINc.

The signal processing unit 601 includes the S/Hs 203a to 203c, the ADCs 204a to 204c, the RAM 205, the serialization unit 206, and the LVDS transmission units 207a to 207g. Those units are components for converting the analog image signals R, G, and B into the image LVDS signals LVD1+, − to LVD6+, −. In addition to those components, the signal processing unit 601 includes the timing signal generation unit 208, a PLL 609, and the serialization control signal generation unit 210. Those units are components for controlling operation timings of the signal processing unit 601 and the line sensor 606, and generating the clock LVDS signal.

The S/Hs 203a to 203c are configured to sample and hold the analog image signals R, G, and B input to the analog input terminals AINa to AINc. The ADCs 204a to 204c are configured to digitalize the analog image signals R, G, and B, sampled and held in the S/Hs 203a to 203c, to generate the digital image signals Da[9:0] to Dc[9:0] of 10 bits per pixel. The ADCs 204a to 204c accumulate the generated digital image signals Da[9:0] to Dc[9:0] in the RAM 205.

The serialization unit 206 sequentially reads out four 10-bit digital image signals DR0[9:0] to DR3[9:0] (equivalent to four pixels) from the RAM 205 at the time when digital image signals of six pixels or more are accumulated. Digital image signals of three pixels are written into the RAM 205 and digital image signals of four pixels are read out from the RAM 205, and thus the reading speed is lower than the writing speed, that is, the frequency of the analog image signals R, G, and B.

The serialization unit 206, the LVDS transmission units 207a to 207f, and the timing signal generation unit 208 have the same configurations as those of FIG. 4, each being configured to perform the same processing. Thus, descriptions thereof are omitted here.

The PLL 609 is configured to generate a clock signal by subjecting the control signal supplied from the timing signal generation unit 208 to multiplication, and supply the generated clock signal to the serialization control signal generation unit 210. For example, when the timing signal generation unit 208 outputs a control signal having a frequency of 40 MHz, the PLL 609 subjects the control signal of 40 MHz to 21/4 multiplication to generate a clock signal of 210 MHz.

The serialization control signal generation unit 210 is configured to generate a read-out control signal for controlling reading out from the RAM 205 and a serialization control signal for controlling serialization by the serialization unit 206 based on the clock signal supplied from the PLL 609. For example, the serialization control signal generation unit 210 generates a read-out control signal of 30 MHz by dividing the clock signal of 210 MHz supplied from the PLL 609 by seven. The clock signal of 210 MHz is used as it is for the serialization control signal. The serialization unit 206 generates, based on the control signal, a synchronization signal that is in synchronization with one frame of the image LVDS signals output by the LVDS transmission units 207a to 207f, and supplies the synchronization signal to the LVDS transmission unit 207g.

The configuration of the image processing unit 211 is the same as that of FIG. 4, and thus a description thereof is omitted here.

Figure 7:
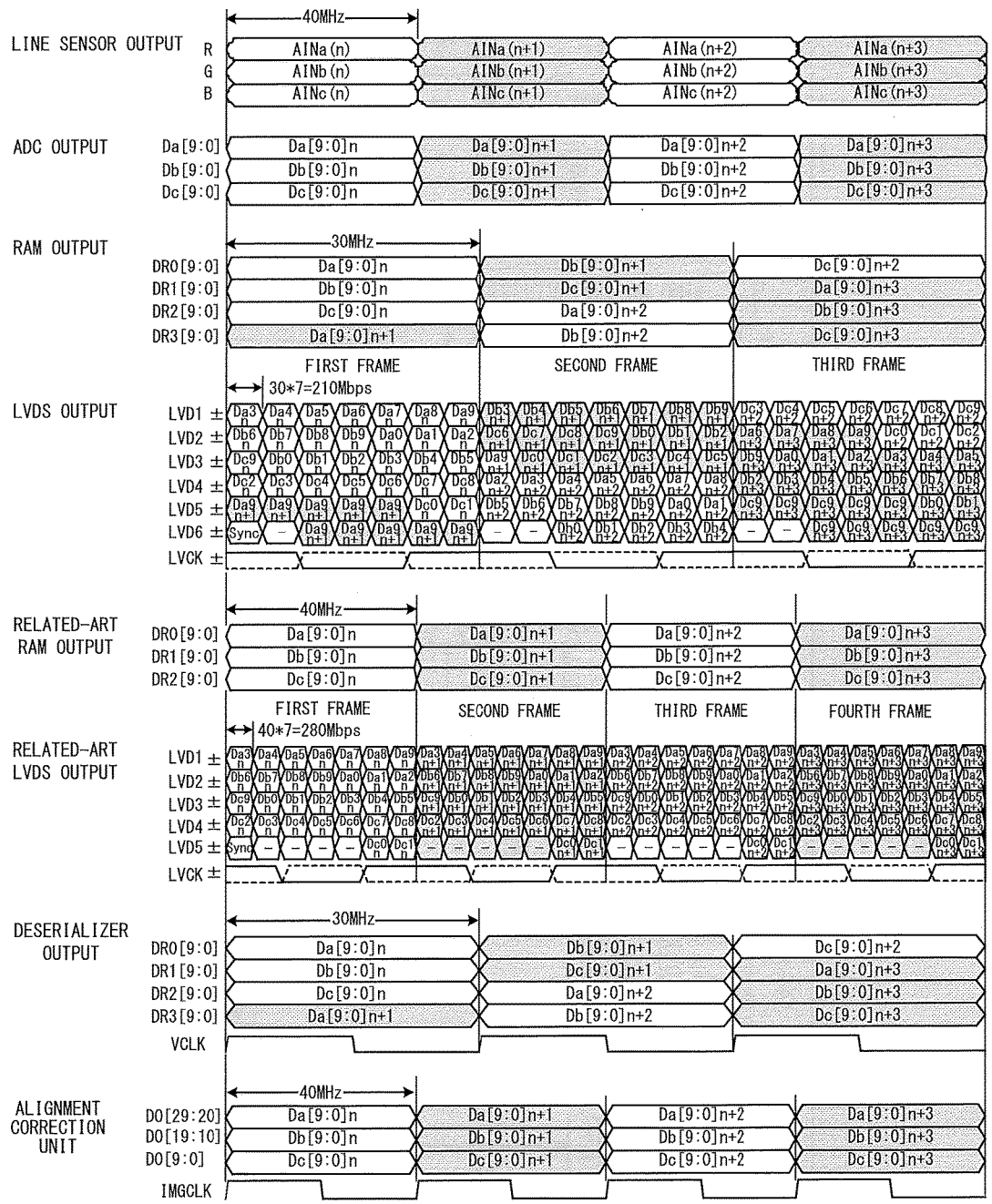
FIG. 7 is a timing chart for illustrating internal processing of the signal processing unit and the image processing unit.

FIG. 7 is a timing chart for illustrating internal processing of the signal processing unit 601 and the image processing unit 211. In this timing chart, the analog image signals R, G, and B are output based on the sensor control signal of 40 MHz from the line sensor 606. Circuit delay is not taken into consideration. In FIG. 7, "n" and "n+1" each represent a pixel order. "n" represents even numbers and "n+1" represents odd numbers.

The ADCs 204a to 204c output the digital image signals Da[9:0] to Dc[9:0] at a data rate corresponding to the frequency of the analog image signals R, G, and B. In this case, the digital image signals Da[9:0] to Dc[9:0] are output at a data rate of 40 MHz. The digital image signals Da[9:0] to Dc[9:0] are written into the RAM 205 at the same writing speed as the data rate.

The image signals DR0[9:0] to DR3[9:0] are read out from the RAM 205 at a lower reading speed than the writing speed. In this chart, the digital image signals DR0[9:0] to DR3[9:0] are read out at a reading speed of 30 MHz. The reading speed is three quarters of the writing speed. The reading speed is a frequency that is lower than the writing speed, namely, the frequency of the analog image signals R, G, and B. Further, the digital image signals Da[9:0] to Dc[9:0] of three pixels are written into the RAM 205 in a single writing operation, and the digital image signals DR0[9:0] to DR3[9:0] of four pixels are read out from the RAM 205 in a single reading operation.

The LVDS transmission units 207a to 207f output the image LVDS signals LVD1+, − to LVD6+, − generated based on the serialized digital image signals DR0[9:0] to DR3[9:0] and the clock LVDS signals LVCK+, −. The serialization unit 206 generates six 7-bit serial signals from the digital image signals DR0[9:0] to DR3[9:0]. Those six 7-bit serial signals are converted into the image LVDS signals LVD1+, − to LVD6+, − and output. The frame frequency of the image LVDS signals LVD1+, − to LVD6+, − is the same as that of the reading speed from the RAM 205, and is 30 MHz. The transfer rate of the image LVDS signals LVD1+, − to LVD6+, − is 210 Mbps, which is seven times the frame frequency, because one frame has 7 bits.

In the related art, the reading speed from the RAM 205 is 40 MHz, and the digital image signals DR0[9:0] to DR2[9:0] of three pixels are read out in a single reading operation. The serialization unit 206 serializes a total of 30 bits of the image signals DR0[9:0] to DR2[9:0] of three pixels into five 7-bit serial signals. The frame frequency of the image LVDS signals LVD1+, − to LVD5+, − converted from the serial signals is 40 MHz because the reading speed from the RAM 205 is 40 MHz. The transfer rate of the image LVDS signals LVD1+, − to LVD5+, − is 280 Mbps, which is seven times the frame frequency, because one frame has 7 bits. Compared to the transfer rate of the related art, in this embodiment, it is possible to transmit the image LVDS signals LVD1+, − to LVD6+, − to the image processing unit 211 at a low speed. Thus, it is possible to prevent degradation of signals caused by the flexible flat cable.

Compared to the case of FIG. 5, the image processing unit 211 performs processing at half the frequency on the image LVDS signals LVD1+, − to LVD6+, − obtained via the flexible flat cable. The image processing unit 211 converts the image LVDS signals LVD1+, − to LVD6+, − into three 10-bit parallel image signals DO[29:20], DO[19:10], and DO[9:0] at the data rate of 40 MHz, and outputs those signals. This data rate is the same speed as the frequency of the analog image signals R, G, and B. When the alignment correction unit 214 reads out an image signal from the RAM 216, the alignment correction unit 214 alternatively reads out image signals corresponding to outputs from the n-th (even-numbered) output terminals and image signals corresponding to outputs from the (n+1)-th (odd-numbered) output terminals of the line sensor 606. In this manner, the alignment correction unit 214 outputs respective 10-bit image signals DO[29:20], DO[19:10], and DO[9:0] from the head of one line of an image in the main scanning direction such that the image signals are arrayed in the same order as the light reception elements of the line sensor 606 in the main scanning direction.

In this manner, even when the line sensor 606 outputs three analog image signals, it is possible to decrease the output rate of the LVDS transmission units 207a to 207f from 280 Mbps of the related art to 210 Mbps. When the line sensor 606 outputs three analog image signals, the signal processing unit 201 of FIG. 4 may have a configuration in which three out of the analog input terminals AINa to AINf, the S/Hs 203a to 203f, and the ADCs 204a to 204f are enabled. In this case, a ½ frequency divider circuit is installed in the subsequent stage of the PLL 209, and a three-terminal analog input mode is prepared for enabling this ½ frequency divider circuit.

As compared to the related art, the image reading apparatus 100 of this embodiment as described above can suppress the transfer rate of data to be transmitted to the control unit 406 from the optical box 101. Thus, even when an inexpensive flexible flat cable having excellent slidability is used as an LVDS signal transmission cable, it is possible to prevent the degradation of LVDS signals. Further, LVDS signals are transmitted at a lower speed than that of the related art, and thus the image reading apparatus 100 can perform reading processing at higher speeds.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-187304, filed Sep. 24, 2015 which is hereby incorporated by reference herein in its entirety.

What is claimed is:

1. A signal processing apparatus comprising:
an AD conversion unit configured to convert six analog image signals obtained from a sensor configured to read a document image into six first signals, each of which is a 10-bit digital image signal, respectively;
a memory unit to which the six first signals are written at a first speed that is the same as a frequency of the six analog image signals;
a serialization unit configured to:
read out from the memory unit four second signals, each of which is a 10-bit digital image signal at a second speed lower than two times the first speed, respectively; and serialize the four second signals to generate six 7-bit serial signals; and a transmission unit configured to convert the six 7-bit serial signals into low-voltage differential signals, respectively, and to transmit the low-voltage differential signals to an apparatus in a subsequent stage.

2. The signal processing apparatus according to claim 1, wherein the serialization unit is configured to read out from the memory unit the four second signals at the second speed that is three quarters of two times the first speed.

3. The signal processing apparatus according to claim 1, further comprising:
   a reception unit configured to convert the six low-voltage differential signals into six single end signals;
   a deserialization unit configured to deserialize the six single end signals for conversion into parallel signals of four pixels;
   a second memory unit to which the parallel signals of four pixels are written at a third speed; and
   an alignment correction unit configured to read out from the second memory unit parallel signals of three pixels at a fourth speed, and to output the read parallel signals as three image signals.

4. The signal processing apparatus according to claim 3, wherein the alignment correction unit is configured to read out from the second memory unit the parallel signals of three pixels such that the parallel signals are arrayed in the same order as an order of elements of the sensor in a main scanning direction, and to output the read parallel signals as the three image signals.

5. The signal processing apparatus according to claim 3, wherein the alignment correction unit is configured to read out from the second memory unit the parallel signals of three pixels at the fourth speed that is two times higher than a frequency of the six analog image signals to be output by the sensor.

6. A signal processing apparatus comprising:
   an AD conversion unit configured to convert three analog image signals obtained from a sensor configured to read a document image into three first signals, each of which is a 10-bit digital image signal, respectively;
   a memory unit to which the three first signals are written at a first speed that is the same as a frequency of the three analog image signals;
   a serialization unit configured to:
     read out from the memory unit the three first signals as four second signals, each of which is a 10-bit digital image signal, at a second speed lower than the first speed, respectively; and
     serialize the four second signals to generate six 7-bit serial signals; and
   a transmission unit configured to convert the six 7-bit serial signals into low-voltage differential signals, respectively, and to transmit the low-voltage differential signals to an apparatus in a subsequent stage.

7. The signal processing apparatus according to claim 6, wherein the serialization unit is configured to read out from the memory unit the four second signals at the second speed that is three quarters of the first speed.

8. The signal processing apparatus according to claim 6, further comprising:
   a reception unit configured to convert the six low-voltage differential signals into six single end signals;
   a deserialization unit configured to deserialize the six single end signals for conversion into parallel signals of four pixels;
   a second memory unit to which the parallel signals of four pixels are written at a third speed; and
   an alignment correction unit configured to read out from the second memory unit parallel signals of three pixels at a fourth speed, and to output the read parallel signals as three image signals.

9. The signal processing apparatus according to claim 8, wherein the alignment correction unit is configured to read out from the second memory unit the parallel signals of three pixels such that the parallel signals are arrayed in the same order as an order of elements of the sensor in a main scanning direction, and to output the read parallel signals as the three image signals.

10. The signal processing apparatus according to claim 8, wherein the alignment correction unit is configured to read out from the second memory unit the parallel signals of three pixels at the fourth speed that is the same as a frequency of the three analog image signals to be output by the sensor.

11. A signal processing method, which is executed by a signal processing apparatus comprising a sensor configured to read a document image, the signal processing method comprising:
   converting six analog image signals obtained from the sensor into six first signals, each of which is a 10-bit digital image signal, respectively;
   writing the six first signals into a predetermined memory unit at a first speed that is the same as a frequency of the six analog image signals;
   reading out from the predetermined memory unit four second signals, each of which is a 10-bit digital image signal, at a second speed lower than two times the first speed, respectively;
   serializing the four second signals to generate six 7-bit serial signals; and
   converting the six 7-bit serial signals into low-voltage differential signals, respectively, so as to transmit the low-voltage differential signals to an apparatus in a subsequent stage.

12. The signal processing method according to claim 11, further comprising reading out from the predetermined memory unit the four second signals at the second speed that is three quarters of two times the first speed.

13. The signal processing method according of claim 11, further comprising:
   converting the six low-voltage differential signals into six single end signals;
   deserializing the six single end signals for conversion into parallel signals of four pixels;
   writing the parallel signals of four pixels into a predetermined second memory unit at a third speed; and
   reading out from the predetermined second memory unit parallel signals of three pixels at a fourth speed, so as to output the read parallel signals as three image signals.

14. The signal processing method according to claim 13, further comprising reading out from the predetermined second memory unit the parallel signals of three pixels such that the parallel signals are arrayed in the same order as an order of elements of the sensor in a main scanning direction, and outputting the read parallel signals as the three image signals.

15. The signal processing method according to claim 13, further comprising reading out from the predetermined second memory unit the parallel signals of three pixels at the fourth speed that is two times higher than a frequency of the six analog image signals to be output by the sensor.

16. A signal processing method, which is executed by a signal processing apparatus comprising a sensor configured to read a document image, the signal processing method comprising:
 converting three analog image signals obtained from the sensor into three first signals, each of which is a 10-bit digital image signal, respectively;
 writing the three first signals into a predetermined memory unit at a first speed that is the same as a frequency of the three analog image signals;
 reading out from the predetermined memory unit the three first signals as four second signals, each of which is a 10-bit digital image signal, at a second speed lower than the first speed, respectively;
 serializing the four second signals to generate six 7-bit serial signals; and
 converting the six 7-bit serial signals into low-voltage differential signals, respectively, so as to transmit the low-voltage differential signals to an apparatus in a subsequent stage.

17. The signal processing method according to claim 16, further comprising reading out from the predetermined memory unit the four second signals at the second speed that is three quarters of the first speed.

18. The signal processing method according to claim 16, further comprising:
 converting the six low-voltage differential signals into six single end signals;
 deserializing the six single end signals for conversion into parallel signals of four pixels;
 writing the parallel signals of four pixels into a predetermined second memory unit at a third speed; and
 reading out from the predetermined second memory unit parallel signals of three pixels at a fourth speed, so as to output the read parallel signals as three image signals.

19. The signal processing method according to claim 18, further comprising reading out from the predetermined second memory unit the parallel signals of three pixels such that the parallel signals are arrayed in the same order as an order of elements of the sensor in a main scanning direction, and outputting the read parallel signals as the three image signals.

20. The signal processing method according to claim 18, further comprising reading out from the predetermined second memory unit the parallel signals of three pixels at the fourth speed that is the same as a frequency of the three analog image signals to be output by the sensor.

* * * * *